(12) United States Patent
Koshita

(10) Patent No.: US 7,692,991 B2
(45) Date of Patent: Apr. 6, 2010

(54) SEMICONDUCTOR MEMORY DEVICE AND METHOD FOR DESIGNING THE SAME

(75) Inventor: Gen Koshita, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/957,523

(22) Filed: Dec. 17, 2007

(65) Prior Publication Data
US 2008/0151589 A1  Jun. 26, 2008

(30) Foreign Application Priority Data
Dec. 25, 2006  (JP) .............................. 2006-347264

(51) Int. Cl.
*G11C 7/02* (2006.01)
(52) U.S. Cl. ....................................... 365/214
(58) Field of Classification Search ................. 365/214, 365/230.03, 51, 63, 69, 185.13, 230.05
See application file for complete search history.

(56) References Cited

U.S. PATENT DOCUMENTS

| 5,691,933 | A | 11/1997 | Takenaka |
| 5,831,928 | A | 11/1998 | Nakano et al. |
| 6,028,813 | A | * 2/2000 | Choi .................... 365/230.04 |
| 6,111,774 | A | * 8/2000 | Shirley ........................ 365/51 |
| 6,333,889 | B1 | * 12/2001 | Arimoto ................ 365/230.03 |
| 6,404,695 | B1 | 6/2002 | Fujino et al. |
| 6,735,133 | B1 | * 5/2004 | Tsukikawa .................. 365/201 |
| 2007/0121361 | A1 | * 5/2007 | Mukai .......................... 365/63 |

FOREIGN PATENT DOCUMENTS

| JP | 8-172169 | 7/1996 |
| JP | 9-139071 | 5/1997 |
| JP | 2001-167572 | 6/2001 |
| JP | 2002-230968 | 8/2002 |

OTHER PUBLICATIONS

Japanese Patent Office issued a Japanese Office Action dated Nov. 18, 2008, Application No. 2006-347264.

* cited by examiner

*Primary Examiner*—Dang T Nguyen
(74) *Attorney, Agent, or Firm*—Young & Thompson

(57) ABSTRACT

A semiconductor memory device includes first and second column selection signal lines, first bit lines being and second bit lines. The first bit lines are associated with the first column selection signal line. The second bit lines are associated with the second column lines. At least one of the first bit lines is positioned between two of the second bit lines.

7 Claims, 6 Drawing Sheets

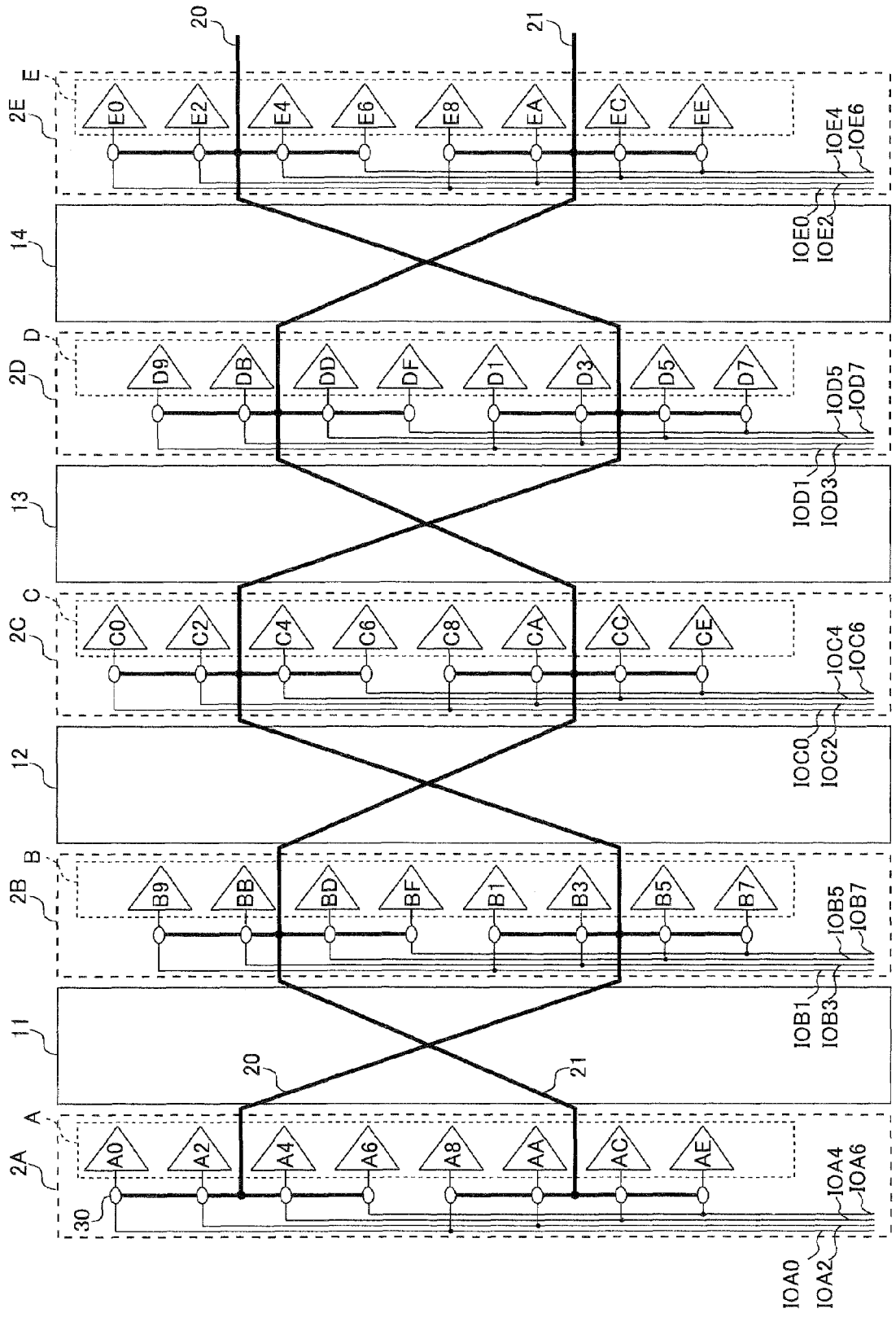

SEMICONDUCTOR MEMORY DEVICE AND METHOD FOR DESIGNING THE SAME

BACKGROUND OF THE INVENTION

This invention relates to a semiconductor memory device and a method for designing the same.

A recent semiconductor memory device such as a DRAM (Dynamic Random Access Memory) device has a reduced size so that its bit lines are arranged very close to each other in the semiconductor memory device. The very close arrangement of bit lines might cause interference between the bit lines.

JP_A 2001-167572 discloses a technique to reduce interference between signal lines close to each other by twisting the signal lines together, the contents of the JP_A 2001-167572 being incorporated herein by reference. However, twisting of bit lines causes a semiconductor memory device to be larger in size. Therefore, there is a need for another technique to reduce interference between bit lines close to each other.

SUMMARY OF THE INVENTION

According to one aspect of the present invention, a semiconductor memory device includes first and second column selection signal lines, first bit lines being and second bit lines. The first bit lines are associated with the first column selection signal line. The second bit lines are associated with the second column lines. At least one of the first bit lines is positioned between two of the second bit lines.

An appreciation of the objectives of the present invention and a more complete understanding of its structure may be had by studying the following description of the preferred embodiment and by referring to the accompanying drawings.

BRIEF DESCRIPTION OF THE DRAWINGS

FIG. 6 is a view showing a semiconductor memory device in accordance with a fifth embodiment of the present invention.

Figure 1:
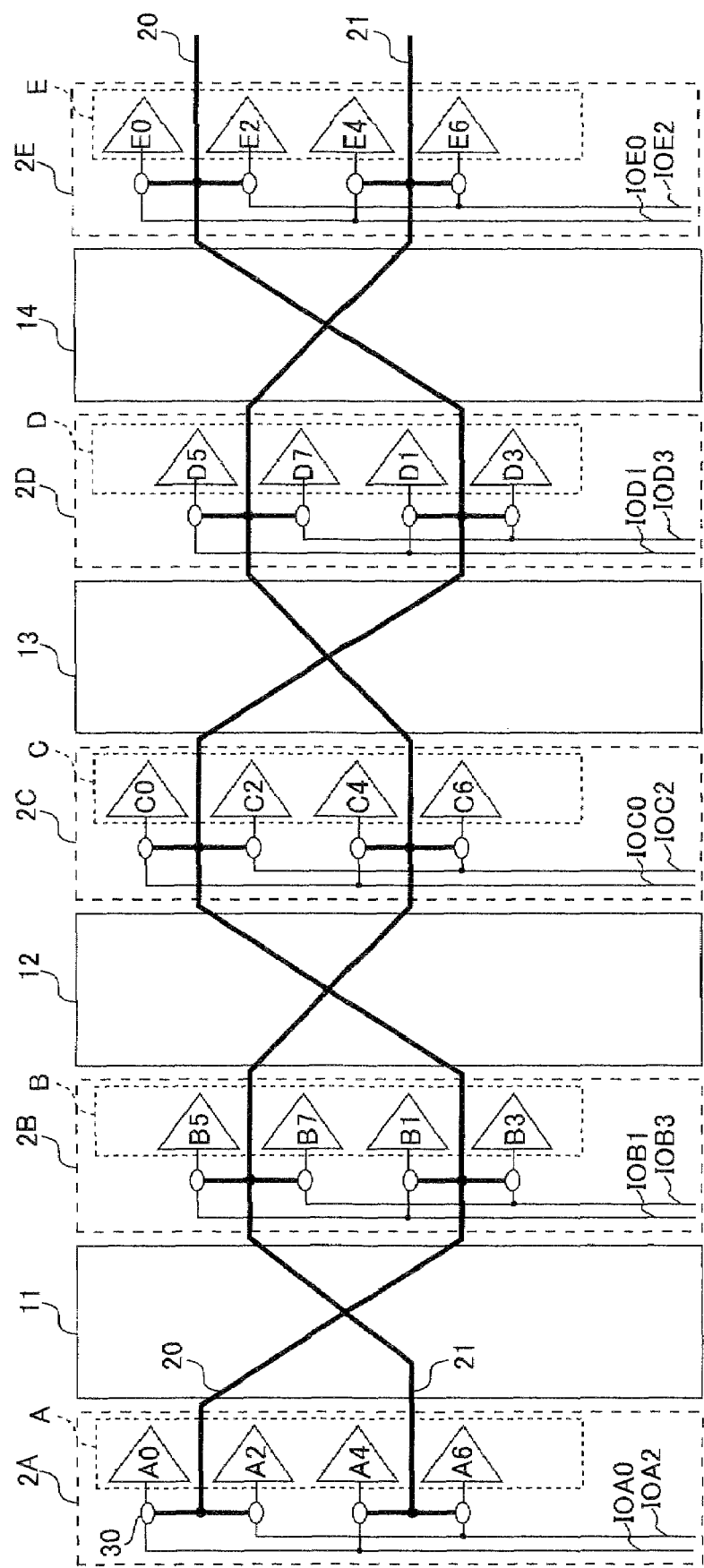
FIG. 1 is a view showing a semiconductor memory device in accordance with a first embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

Figure 2:
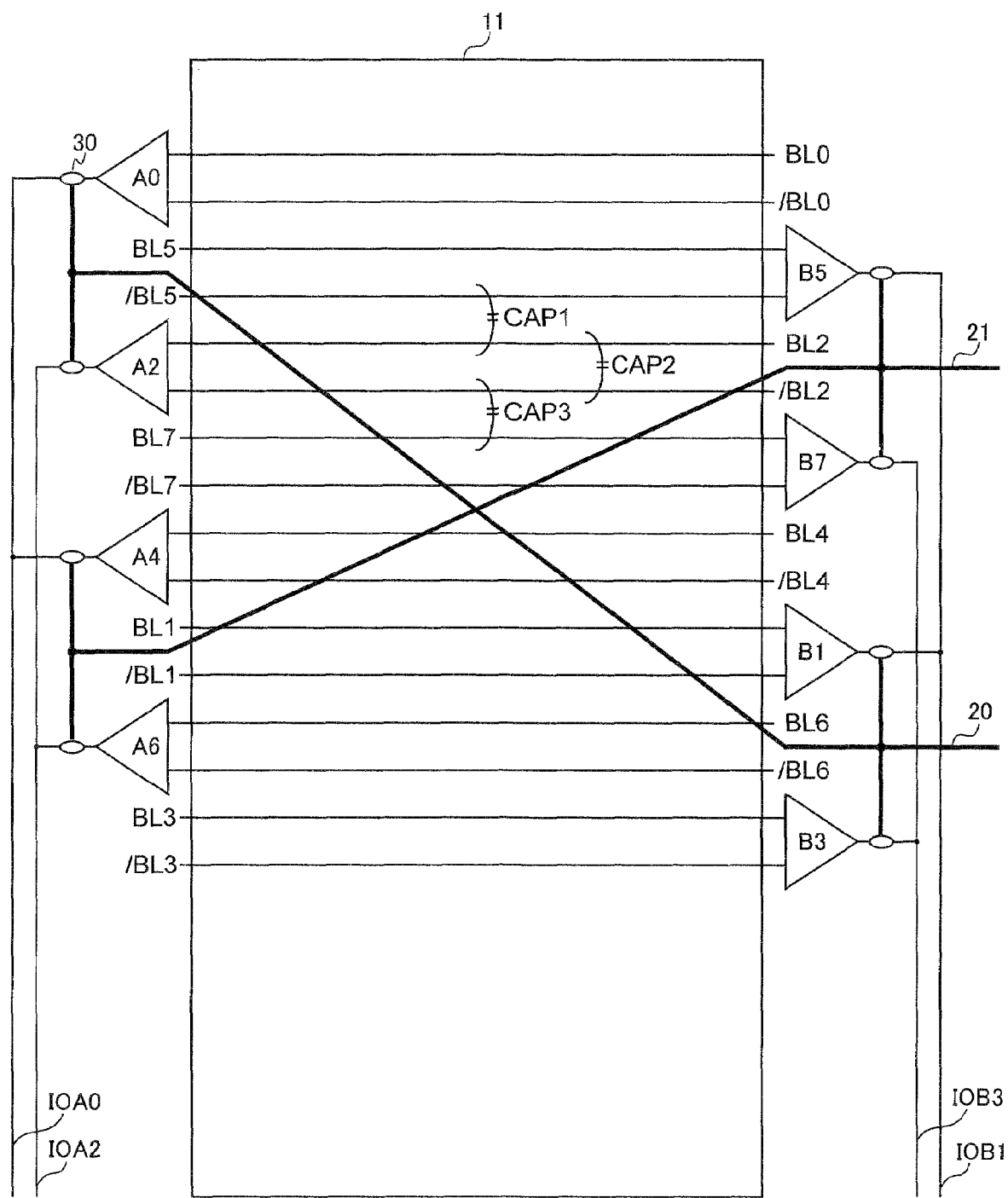
FIG. 2 is a view showing one memory cell plate and elements therearound of the semiconductor memory device of FIG. 1.

With reference to FIGS. 1 and 2, a semiconductor memory device according to a first embodiment of the present is a DRAM device and comprises a plurality of memory cell plates 11, 12, 13, 14, a plurality of sense amplifier regions 2A, 2B, 2C, 2D, 2E, a plurality of sense amplifier groups A, B, C, D, E, a plurality of bit lines BL0-BL7, /BL0-/BL7, a plurality of word lines (not shown), a plurality of column switches 30, a plurality of input/output (I/O) lines IOA0-IOE2 and column selection signal lines 20, 21. In this embodiment, each of the bit lines BL0-BL7, /BL0-/BL7 extends along a first direction, while each of the word lines extends along a second direction perpendicular to the first direction. In FIGS. 1 and 2, only elements associated with two column selection signal lines 20, 21 are illustrated for the sake of clarity, but the present invention is not limited thereto. For example, the semiconductor memory device may comprise four (or other multiples of two) column selection signal lines and, in correspondence therewith, a repeated structure consisting of the other elements.

As shown in FIG. 1, the memory cell plates 11 to 14 and the sense amplifier regions 2A to 2E are alternately arranged in the first direction. In detail, the memory cell plate 11 is positioned between the sense amplifier regions 2A, 2B. The memory cell plate 12 is positioned between the sense amplifier regions 2B, 2C. The memory cell plate 13 is positioned between the sense amplifier regions 2C, 2D. The memory cell plate 14 is positioned between the sense amplifier regions 2D, 2E.

As shown in FIG. 1, the sense amplifier groups A to E are arranged on the sense amplifier regions 2A to 2E, respectively. In detail, the sense amplifier group A consists of sense amplifiers A0, A2, A4, A6 arranged in the second direction. The sense amplifier group B consists of sense amplifiers B1, B3, B5, B7 arranged in the second direction. The sense amplifier group C consists of sense amplifiers C0, C2, C4, C6 arranged in the second direction. The sense amplifier group D consists of sense amplifiers D1, D3, D5, D7 arranged in the second direction. The sense amplifier group E consists of sense amplifiers E0, E2, E4, E6 arranged in the second direction. In this embodiment, each neighboring two sense amplifiers in the second direction constitute one sense amplifier set.

As apparent from the above description, the numeral reference of each sense amplifier is determined by a combination of an alphabet showing the sense amplifier group A to E of the sense amplifier in question and a Y-address corresponding to the sense amplifier in question. For example, the numeral reference A2 indicates the sense amplifier which belongs to the sense amplifier group A and corresponds to the Y-address of "2" (Y=2). Similarly, the numeral reference B7 indicates the sense amplifier which belongs to the sense amplifier group B and corresponds to the Y-address of "7" (Y=7).

The semiconductor memory device of the present embodiment has a shared-sense amplifier structure arrangement where one sense amplifier is coupled to and is shared by two bit line pairs. In addition, the semiconductor memory device of the present embodiment has a folded bit line structure where two bit lines constituting one bit line pair extend over one memory cell plate along the first direction is parallel to each other, as shown in FIG. 2. FIG. 2 shows a relation between the memory cell plate 11 and the bit lines BL0-BL7, /BL0-/BL7, wherein the bit lines BL0-BL7, /BL0-/BL7 extend over the memory cell plate 11. Specifically, the bit lines BL0, /BL0 extend from the sense amplifier A0, the bit lines BL2, /BL2 extend from the sense amplifier A2, the bit lines BL4, /BL4 extend from the sense amplifier A4, and the bit lines BL6, /BL6 extend from the sense amplifier A6. Likewise, the bit lines BL1, /BL1 extend from the sense amplifier B1, the bit lines BL3, /BL3 extend from the sense amplifier B3, the bit lines BL5, /BL5 extend from the sense amplifier B5, and the bit lines BL7, /BL7 extend from the sense amplifier B7.

As apparent from FIG. 2, the bit lines BL0, /BL0, BL2, /BL2, BL4, /BL4, BL6, /BL6 are connected to the sense amplifiers A0, A2, A4, A6 of the sense amplifier group A, while the bit lines BL1, /BL1, BL3, /BL3, BL5, /BL5, BL7, /BL7 are connected to the sense amplifiers B1, B3, B5, B7 of the sense amplifier group B, which is different from the sense amplifier group A. In other words, the bit lines BL0, /BL0, BL2, /BL2, BL4, /BL4, BL6, /BL6 is associated with the sense amplifier group A, while the bit lines BL1, /BL1, BL3, /BL3, BL5, /BL5, BL7, /BL7 is associated with the sense amplifier group B, which is different from the sense amplifier group A. In this embodiment, the bit lines pairs associated with the sense amplifier group A and the bit lines pairs associated with the sense amplifier group B are alternately arranged in the second direction.

As shown in FIGS. 1 and 2, each of the column switches 30 is connected to one of the sense amplifiers A0-E6. In addition, each of the I/O lines IOA0-IOE2 is connected two column switches 30. The illustrated semiconductor memory device comprises one I/O line for one data signal line but may have a complementary I/O line pair for one data signal.

As apparent from FIGS. 1 and 2, two column switches 30 connected to one I/O line are coupled to the sense amplifiers which belong to the same sense amplifier group but belong to the sense amplifier sets different from each other. In other words, each of the I/O lines is connected to every other sense amplifiers within each of the sense amplifier regions. Specifically, the I/O line IOA0 is connected to the column switches 30 coupled to the sense amplifiers A0, A4, and the I/O line IOA2 is connected to the column switches 30 coupled to the sense amplifiers A2, A6. Likewise, the I/O line IOB1 is connected to the column switches 30 coupled to the sense amplifiers B1, B5, and the I/O line IOB3 is connected to the column switches 30 coupled to the sense amplifiers B3, B7; the I/O line IOC0 is connected to the column switches 30 coupled to the sense amplifiers C0, C4, and the I/O line IOC2 is connected to the column switches 30 coupled to the sense amplifiers C2, C6; the I/O line IOD1 is connected to the column switches 30 coupled to the sense amplifiers D1, D5, and the I/O line IOD3 is connected to the column switches 30 coupled to the sense amplifiers D3, D7; the I/O line IOE0 is connected to the column switches 30 coupled to the sense amplifiers E0, E4, and the I/O line IOE2 is connected to the column switches 30 coupled to the sense amplifiers E2, E6.

As shown in FIGS. 1 and 2, each of the column selection signal lines 20, 21 is connected to one of the sense amplifier sets through two column switches 30 on every sense amplifier region. Specifically, the column selection signal line 20 is coupled to the sense amplifiers A0, A2 on the sense amplifier region 2A, to the sense amplifiers B1, B3 on the sense amplifier region 2B, to the sense amplifiers C0, C2 on the sense amplifier region 2C, to the sense amplifiers D1, D3 on the sense amplifier region 2D, and to the sense amplifiers E0, E2 on the sense amplifier region 2E, respectively. Likewise, the column selection signal line 21 is coupled to the sense amplifiers A4, A6 on the sense amplifier region 2A, to the sense amplifiers B5, B7 on the sense amplifier region 2B, to the sense amplifiers C4, C6 on the sense amplifier region 2C, to the sense amplifiers D5, D7 on the sense amplifier region 2D, and to the sense amplifiers E4, E6 on the sense amplifier region 2E, respectively. The illustrated column selection signal lines 20, 21 are twisted in multiple points. In this embodiment, the twist points of the column selection signal lines 20, 21 are positioned on the respective memory cell plates 11 to 14. If the semiconductor memory device has multiple pairs of the column selection signal lines, each two column selection signal lines constituting one pair are twisted in the same manner as mentioned above.

As shown in FIG. 2, the configuration of the column selection signal lines 20, 21 causes the bit lines BL0-BL7, /BL0-/BL7 to meet the following condition at least in part: a first bit line is positioned between a second bit line and a third bit line on one of the memory cell plates, where: the first bit line is at least one of the bit lines extending from a first one of the sense amplifiers connected to a first one of the column selection signal lines; the second bit line is one of the bit lines extending from a second one of the sense amplifiers connected to a second one of the column selection signal lines; the third bit line is one of the bit lines extending from a third one of the sense amplifiers connected to the second column selection signal line; the first to the third sense amplifiers are different from each other; and the first and the second column selection signal lines are different from each other. In particular, the bit lines BL0-BL7, /BL0-/BL7 meet the following additional condition at least in part: a first bit line pair is positioned between a second bit line pair and a third bit line pair on one of the memory cell plates, where: the first bit line pair consists of the bit lines extending from the first sense amplifier; the second bit line pair consists of the bit lines extending from the second sense amplifier; and the third bit line pair consists of the bit lines extending from the third sense amplifier. It is preferable that the above-mentioned conditions are met by all of the bit lines, but the present invention may allow the above-mentioned arrangement of the bit lines BL0-BL7, /BL0-/BL7; for example, the bit lines BL4 and /BL7 do not meet the above-mentioned conditions.

As apparent from FIG. 2, the bit lines pairs associated with the column selection signal line 20 and the bit lines pairs associated with the column selection signal line 21 are alternately arranged in the second direction on the memory cell plate 11. In other words, the column selection signal lines 20, 21 are arranged so that at least one of the bit lines associated with the column selection signal line 20 is positioned between two of the bit lines associated with the column selection signal line 21. Specifically, the bit lines BL5, /BL5 are positioned between the bit line /BL0 and the bit line BL2 to avoid interference therebetween. Likewise, the bit lines BL2, /BL2 are positioned between the bit line /BL5 and the bit line BL7; the bit lines BL7, /BL7 are positioned between the bit line /BL2 and the bit line BL4; the bit lines BL4, /BL4 are positioned between the bit line /BL7 and the bit line BL1; the bit lines BL1, /BL1 are positioned between the bit line /BL4 and the bit line BL6; and the bit lines BL6, /BL6 are positioned between the bit line /BL1 and the bit line BL3. The other bit line pairs are arranged on the respective memory cell plates 12 to 14 in the same manner as mentioned above.

Next explain will be made about the operations of the above-described semiconductor memory device, especially, the operations in connection with the memory cell plate 11 with reference to FIG. 11, wherein the semiconductor memory device of the present embodiment operates at CL (CAS Latency)=3, BL (Burst Length)=4. For example, when a write command is input together with a Y-address of "0" (Y=0), a write operation is carried out for memory cells corresponding to each of four Y-addresses of "0", "1", "2", "3". For the write operation, write data are transferred through the I/O lines IOA0, IOB1, IOA2, IOB3 while the column selection signal line 20 is activated in response to the write command so that the write data are transferred to the sense amplifiers A0, B1, A2, B3, respectively. Thus, the write data are provided for the bit lines BL0, /BL0, BL1, /BL1, BL2, /BL2, BL3, /BL3. However, because of the above-mentioned arrangement of the bit lines BL0-BL7, /BL0-/BL7, the bit lines BL0, /BL0, BL1, /BL1, BL2, /BL2, BL3, /BL3 are prevented from interfering with each other even if all states of the bit lines BL0, /BL0, BL1, /BL1, BL2, /BL2, BL3, /BL3 are changed upon the write operation. For example, the bit line BL2 and the bit line /BL5 have a coupling capacitance CAP1 therebetween. However, the bit line /BL5 is not activated upon the write operation to the bit line BL2. Therefore, there is no interference between the bit line BL2 and the bit line /BL5. The bit line /BL2 and the bit line BL7 have a coupling capacitance CAP3 therebetween. However, the bit line BL7 is not activated upon the write operation to the bit line /BL2. Therefore, there is no interference between the bit line /BL2 and the bit line BL7. The effect can be seen in the write operations to the bit lines /BL0, BL1, /BL1, BL3. In other words, the bit lines pairs associated with the column selection signal line 20 are prevented from interfering with each other. Likewise, the bit lines pairs associated with the column selection signal line 21 are prevented from interfering with each other.

Figure 3:
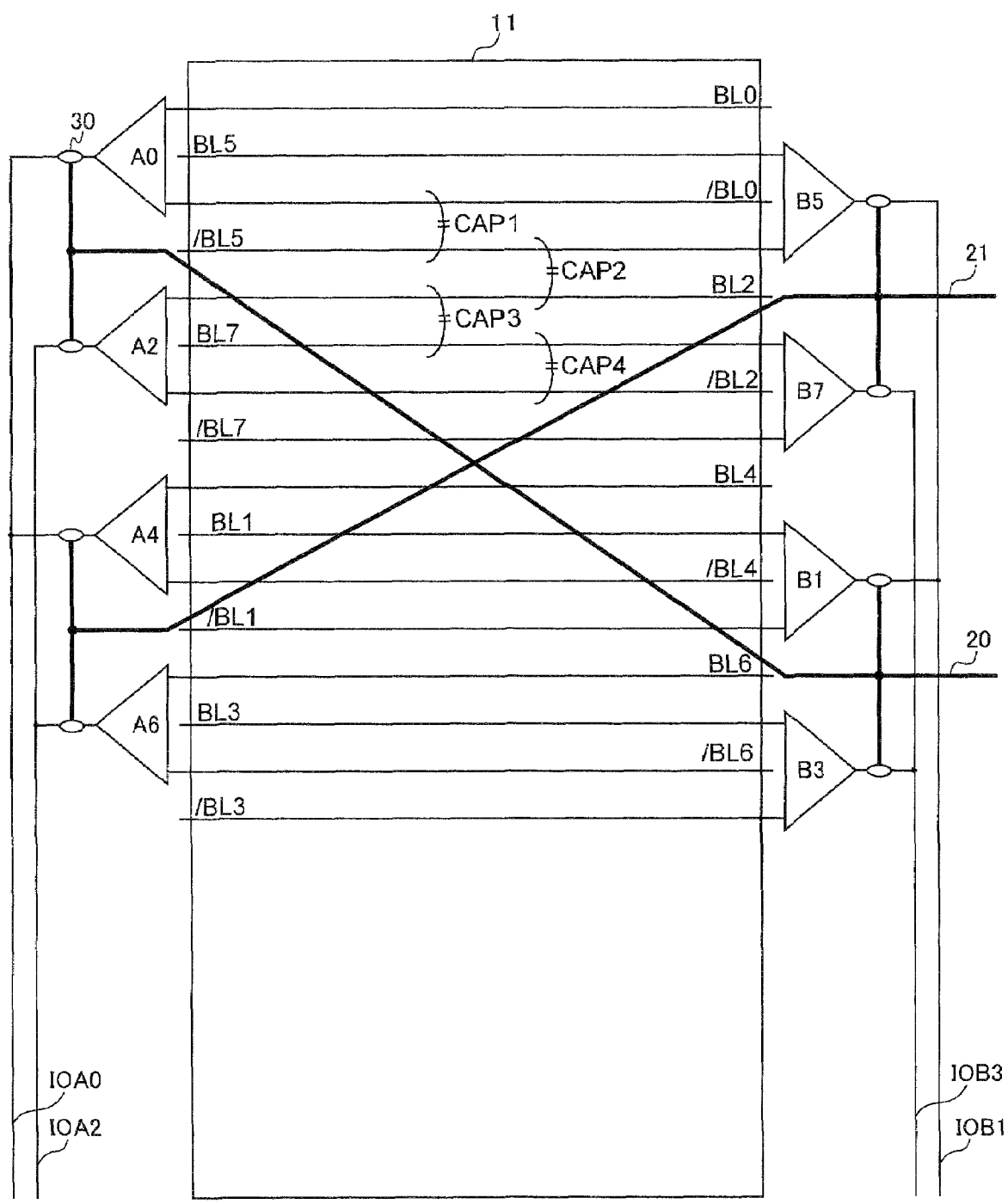
FIG. 3 is a view showing one memory cell plate and elements therearound in accordance with a second embodiment of the present invention.

With reference to FIG. 3, a semiconductor memory device according to a second embodiment of the present invention is a modification of the first embodiment. Hereinafter, the descriptions for the elements similar to those of the first embodiment are omitted for the sake of clarity.

With reference to FIG. 3, the semiconductor memory device of the present embodiment has another folded bit line structure where two bit lines constituting one bit line pair extend in a manner similar to the first embodiment, but two bit line pairs are arranged different from the first embodiment. In detail, two bit lines constituting one bit line pair extend over one memory cell plate along the first direction is parallel to each other, as shown in FIG. 3. However, one bit line of one bit line pair is positioned between two bit lines of another bit line pair in this embodiment. Specifically, as for the sense amplifiers A0, B5, the bit line BL5 is positioned between the bit lines BL0, /BL0, while the bit line /BL0 is positioned between the bit lines BL5, /BL5. Likewise, as for the sense amplifiers A2, B7, the bit line BL7 is positioned between the bit lines BL2, /BL2, while the bit line /BL2 is positioned between the bit lines BL7, /BL7; as for the sense amplifiers A4, B1, the bit line BL1 is positioned between the bit lines BL4, /BL4, while the bit line /BL4 is positioned between the bit lines BL1, /BL1; and as for the sense amplifiers A6, B3, the bit line BL3 is positioned between the bit lines BL6, /BL6, while the bit line /BL6 is positioned between the bit lines BL3, /BL3. In addition, the bit lines BL0, /BL0, BL2, /BL2, BL1, /BL1, BL3, /BL3 are associated with the column selection signal line 20, while the bit lines BL5, /BL5, BL7, /BL7, BL4, /BL4, BL6, /BL6 are associated with the column selection signal line 21.

As shown in FIG. 3, the above-mentioned structure causes the bit lines BL0-BL7, /BL0-/BL7 to meet the following condition at least in part: a first bit line is positioned between a second bit line and a third bit line on one of the memory cell plates, where: the first bit line is at least one of the bit lines extending from a first one of the sense amplifiers connected to a first one of the column selection signal lines; the second bit line is one of the bit lines extending from a second one of the sense amplifiers connected to a second one of the column selection signal lines; the third bit line is one of the bit lines extending from a third one of the sense amplifiers connected to the second column selection signal line; the first to the third sense amplifiers are different from each other; and the first and the second column selection signal lines are different from each other. In particular, the bit lines BL0-BL7, /BL0-/BL7 meet the following additional condition at least in part: a pair of the bit lines coupled to the first sense amplifier constitutes a first one of the bit line pairs; another pair of the bit lines coupled to the second sense amplifier constitutes a second one of the bit line pairs, and one of the bit lines constituting the first bit line pair is positioned between the bit lines constituting the second bit line pair. It is preferable that the above-mentioned conditions are met by all of the bit lines, but the present invention may allow the above-mentioned arrangement of the bit lines BL0-BL7, /BL0-/BL7; for example, the bit lines BL4 and /BL7 do not meet the above-mentioned conditions.

With the above-mentioned structure, the bit lines BL0, /BL0, BL2, /BL2, BL1, /BL1, BL3, /BL3 are not activated upon the write operations to the bit lines BL5, /BL5, BL7, /BL7, BL4, /BL4, BL6, /BL6. Likewise, the bit lines BL5, /BL5, BL7, /BL7, BL4, /BL4, BL6, /BL6 are not activated upon the write operations to the bit lines BL0, /BL0, BL2, /BL2, BL1, /BL1, BL3, /BL3. Therefore, the coupling capacitance CAP1 between the bit lines /BL0, /BL5 does not have a bad influence on the signal transmissions through the bit lines /BL0, /BL5. Likewise, the coupling capacitance CAP2 between the bit lines /BL5, BL2, the coupling capacitance CAP3 between the bit lines BL2, BL7, and the coupling capacitance CAP4 between the bit lines BL7, /BL2 do not have any bad influences on the signal transmissions through the bit lines.

Figure 4:
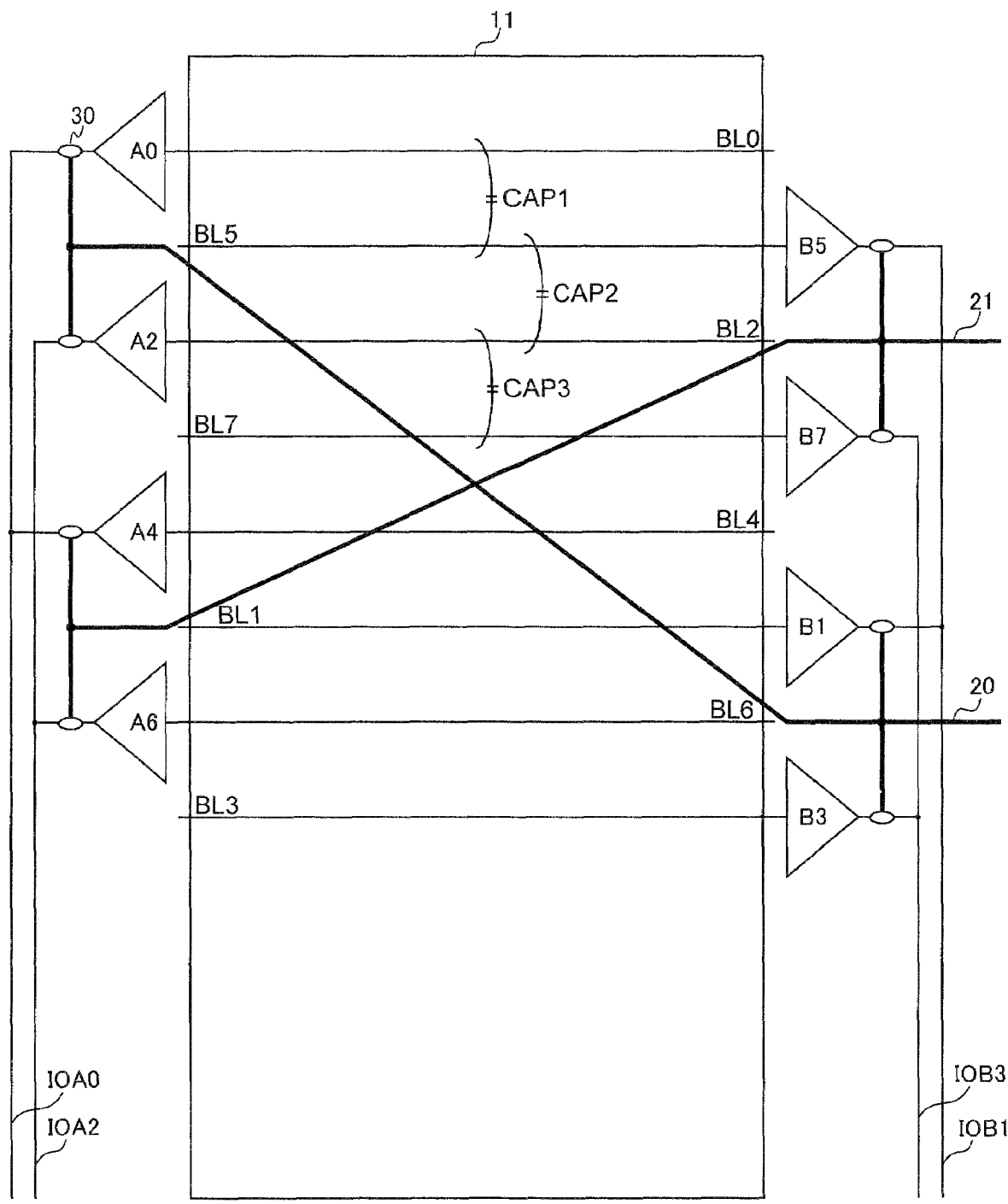
FIG. 4 is a view showing one memory cell plate and elements therearound in accordance with a third embodiment of the present invention.

With reference to FIG. 4, a semiconductor memory device according to a third embodiment of the present invention is a modification of the first embodiment. Hereinafter, the descriptions for the elements similar to those of the first embodiment are omitted for the sake of clarity.

With reference to FIG. 4, the semiconductor memory device of the present embodiment has an open bit line structure where two bit lines constituting one bit line pair extend over the respective memory cell plates different from each other.

For example, the bit line BL5 extends from the sense amplifier B5 over the memory cell plate 11, as shown in FIG. 4, while the bit line /BL5 extends from the sense amplifier B5 over the memory cell plate 12 next to the memory cell plate 11. Likewise, the bit line BL7 extends from the sense amplifier B7 over the memory cell plate 11, as shown in FIG. 4, while the bit line /BL7 extends from the sense amplifier B7 over the memory cell plate 12 next to the memory cell plate 11.

In this embodiment, the bit line BL0, the bit line BL5, the bit line BL2, the bit line BL7, the bit line BL4, the bit line BL1, the bit line BL6 and the bit line BL3 are arranged over the memory cell plate 11 along the second direction in this order. In addition, the bit lines BL0, BL2, BL1, BL3 are associated with the column selection signal line 20, while the bit lines BL5, BL7, BL1, BL3 are associated with the column selection signal line 21.

As shown in FIG. 3, the above-mentioned structure causes the bit lines BL0-BL7, /BL0-/BL7 to meet the following condition at least in part: a first bit line is positioned between a second bit line and a third bit line on one of the memory cell plates, where: the first bit line is at least one of the bit lines extending from a first one of the sense amplifiers connected to a first one of the column selection signal lines; the second bit line is one of the bit lines extending from a second one of the sense amplifiers connected to a second one of the column selection signal lines; the third bit line is one of the bit lines extending from a third one of the sense amplifiers connected to the second column selection signal line; the first to the third sense amplifiers are different from each other; and the first and the second column selection signal lines are different from each other. Specifically, the bit line BL5 is positioned between the bit lines BL0, BL2; the bit line BL2 is positioned between the bit lines BL5, BL7; the bit line BL1 is positioned between the bit lines BL4, BL6; and the bit lines BL6 is positioned between the bit lines BL1, BL3. It is preferable that the above-mentioned condition is met by all of the bit lines, but the present invention may allow the above-mentioned arrangement of the bit lines BL0-BL7, /BL0-BL7; for example, the bit lines BL4 and /BL7 do not meet the above-mentioned condition.

With the above-mentioned structure, the bit lines BL0, BL2, BL1, BL3 are not activated upon the write operations to the bit lines BL5, BL7, BL4, BL6. Likewise, the bit lines BL5, BL7, BL4, BL6 are not activated upon the write operations to the bit lines BL0, BL2, BL1, BL3. Therefore, the coupling capacitance CAP1 between the bit lines BL0, BL5 does not have a bad influence on the signal transmissions through the bit lines BL0, BL5. Likewise, the coupling capacitance CAP2 between the bit lines BL5, BL2 and the coupling capacitance CAP3 between the bit lines BL2, BL7 do not have any bad influences on the signal transmissions through the bit lines.

Figure 5:
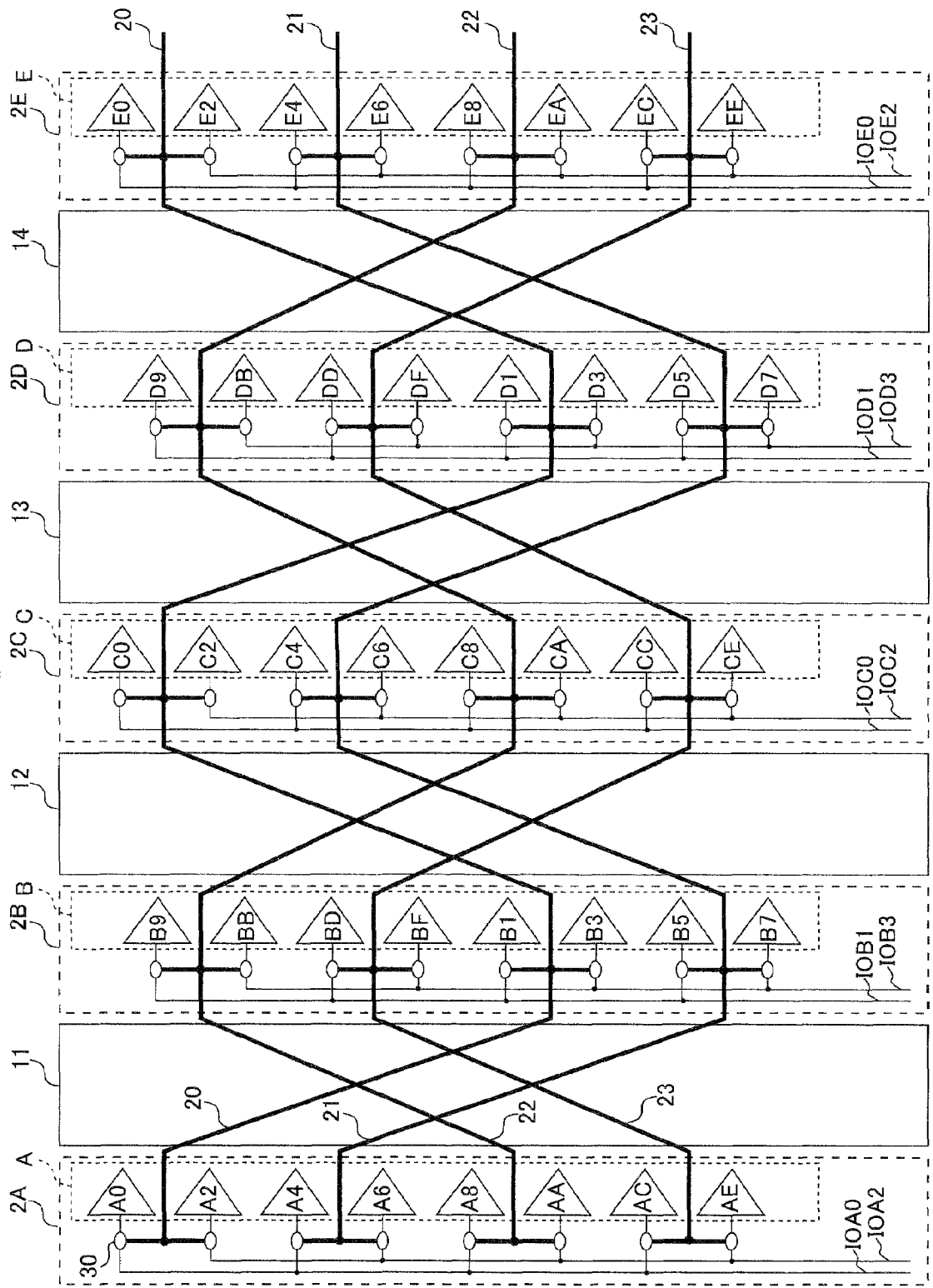
FIG. 5 is a view showing a semiconductor memory device in accordance with a fourth embodiment of the present invention.

With reference to FIG. 5, a semiconductor memory device according to a fourth embodiment of the present invention is a modification of the first embodiment. Hereinafter, the descriptions for the elements similar to those of the first embodiment are omitted for the sake of clarity.

The illustrated semiconductor memory device comprises four column selection signal lines 20, 21, 22, 23, wherein every other column selection signal lines 20, 21, 22, 23 constitute one pair, and the column selection signal lines 20, 21, 22, 23 of the respective pairs are twisted. In other words, first and third column selection signal lines 20, 22 constitute one pair and are twisted, while second and fourth column selection signal lines 21, 23 constitute another pair and are twisted. Specifically, the column selection signal lines 20, 22 constitute one pair and are twisted, while the column selection signal lines 21, 23 constitute another pair and are twisted. The pair of the column selection signal lines 20, 22 overlap with the other pair of the column selection signal lines 21, 23. In other words, the twisted column selection signal lines 20, 22 overlap with the other twisted column selection signal lines 21, 23. The semiconductor memory device may comprise eight (or other multiples of four) column selection signal lines and, in correspondence therewith, a repeated structure consisting of the other elements.

As shown in FIG. 5, each of the column selection signal lines 20, 21, 22, 23 is connected to one of the sense amplifier sets through two column switches 30 on every sense amplifier region. For example, the column selection signal line 20 is coupled to the sense amplifiers A0, A2 on the sense amplifier region 2A, to the sense amplifiers B1, B3 on the sense amplifier region 2B, to the sense amplifiers C0, C2 on the sense amplifier region 2C, to the sense amplifiers D1, D3 on the sense amplifier region 2D, and to the sense amplifiers E0, E2 on the sense amplifier region 2E, respectively. Likewise, the column selection signal line 23 is coupled to the sense amplifiers AC, AE on the sense amplifier region 2A, to the sense amplifiers BD, BF on the sense amplifier region 2B, to the sense amplifiers CC, CE on the sense amplifier region 2C, to the sense amplifiers DD, DF on the sense amplifier region 2D, and to the sense amplifiers EC, EE on the sense amplifier region 2E, respectively. The other column selection signal lines 21, 22 are coupled to the remaining sense amplifiers in a manner as mentioned above.

The semiconductor memory device may have a folded bit line structure or an open bit line structure, provided that the column selection signal lines 20, 21, 22, 23 are configured to cause the bit lines to meet the following condition at least in part: a first bit line is positioned between a second bit line and a third bit line on one of the memory cell plates, where: the first bit line is at least one of the bit lines extending from a first one of the sense amplifiers connected to a first one of the column selection signal lines; the second bit line is one of the bit lines extending from a second one of the sense amplifiers connected to a second one of the column selection signal lines; the third bit line is one of the bit lines extending from a third one of the sense amplifiers connected to the second column selection signal line; the first to the third sense amplifiers are different from each other; and the first and the second column selection signal lines are different from each other. It is preferable that the above-mentioned condition is met by all of the bit lines, but the present invention may allow the above-mentioned arrangement of the bit lines.

With the above-mentioned structure, when a write operation is carried out for the bit lines associated with one of the column selection signal lines 20 to 23, the bit lines associated with the other column selection signal lines 20 to 23 are not activated. For example, the bit lines associated with the other column selection signal lines 21 to 23 are not activated upon the write operation to the bit lines associated with the column selection signal line 20. Therefore, interference between neighboring bit lines is prevented.

The above-mentioned present embodiment may be modified, provided that the column selection signal lines 20, 21, 22, 23 are configured to cause the bit lines to meet the following condition at least in part: a first bit line is positioned between a second bit line and a third bit line on one of the memory cell plates, where: the first bit line is at least one of the bit lines extending from a first one of the sense amplifiers connected to a first one of the column selection signal lines; the second bit line is one of the bit lines extending from a second one of the sense amplifiers connected to a second one of the column selection signal lines; the third bit line is one of the bit lines extending from a third one of the sense amplifiers connected to the second column selection signal line; the first to the third sense amplifiers are different from each other; and the first and the second column selection signal lines are different from each other. It is preferable that the above-mentioned condition is met by all of the bit lines, but the present invention may allow the above-mentioned arrangement of the bit lines.

For example, the present embodiment may be modified so that the semiconductor memory device comprises first to sixth column selection signal lines, wherein first and fourth column selection signal lines constitute one pair and are twisted, second and fifth column selection signal lines constitute another pair are twisted, and third and sixth column selection signal lines constitute yet another pair and twisted. In this case, the semiconductor memory device may further comprise twelve (or other multiples of six) column selection signal lines and, in correspondence therewith, a repeated structure consisting of the other elements.

Alternatively, the present embodiment may be modified so that the semiconductor memory device comprises three column selection signal lines which are twisted. In this case, the semiconductor memory device may further comprise six (or other multiples of three) column selection signal lines and, in correspondence therewith, a repeated structure consisting of the other elements.

With reference to FIG. 6, a semiconductor memory device according to a fifth embodiment of the present invention is a modification of the first embodiment. Hereinafter, the descriptions for the elements similar to those of the first embodiment are omitted for the sake of clarity.

In the illustrated semiconductor memory device, four sense amplifiers constitute one sense amplifier set so that each column selection signal line 20, 21 is connected to four sense amplifiers through two column switches 30 on every sense amplifier region. For example, the column selection signal line 20 is connected to the sense amplifiers A0, A2, A4, A6 on the sense amplifier region 2A, is connected to the sense amplifiers B1, B3, B5, B7 on the sense amplifier region 2B, is connected to the sense amplifiers C0, C2, C4, C6 on the sense amplifier region 2C, is connected to the sense amplifiers D1, D3, D5, D7 on the sense amplifier region 2D, and is connected to the sense amplifiers E0, E2, E4, E6 on the sense amplifier region 2E.

In this embodiment, the column selection signal lines 20, 21 are twisted so that the bit lines meet the following condition at least in part: a first bit line is positioned between a second bit line and a third bit line on one of the memory cell plates, where: the first bit line is at least one of the bit lines extending from a first one of the sense amplifiers connected to a first one of the column selection signal lines; the second bit line is one of the bit lines extending from a second one of the sense amplifiers connected to a second one of the column selection signal lines; the third bit line is one of the bit lines extending from a third one of the sense amplifiers connected to the second column selection signal line; the first to the third sense amplifiers are different from each other; and the first and the second column selection signal lines are different from each other. It is preferable that the above-mentioned condition is met by all of the bit lines, but the present invention may allow the above-mentioned arrangement of the bit lines.

The semiconductor memory device may have a folded bit line structure or an open bit line structure, provided that the above-mentioned condition is met.

Furthermore, the present embodiment may be modified so that the number of sense amplifiers constituting one sense amplifier set is three, five or more. In addition, various configurations of twisted column selection signal lines expected from the fourth embodiment may be applied to the modification.

The present application is based on a Japanese patent application of JP2006-347264 filed before the Japan Patent Office on Dec. 25, 2006, the contents of which are incorporated herein by reference.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A semiconductor memory device comprising:
   a plurality of memory cell plates;
   a plurality of sense amplifier regions, the memory cell plates and the sense amplifier regions being alternately arranged in a first direction,
   a plurality of sense amplifier groups arranged on the sense amplifier regions, respectively, each of the sense amplifier groups consisting of a plurality of sense amplifiers arranged in a second direction perpendicular to the first direction;
   a plurality of bit lines, each of which is connected to one of the sense amplifiers and extending over one of the memory cell plates; and
   column selection signal lines, each of which is connected to at least one of the sense amplifiers on every sense amplifier region so that a first bit line is positioned between a second bit line and a third bit line on one of the memory cell plates, wherein the first bit line is at least one of the bit lines extending from a first one of the sense amplifiers connected to a first one of the column selection signal lines, the second bit line is one of the bit lines extending from a second one of the sense amplifiers connected to a second one of the column selection signal lines, the third bit line is one of the bit lines extending from a third one of the sense amplifiers connected to the second column selection signal line, the first to the third sense amplifiers are different from each other, and the first and the second column selection signal lines are different from each other.

2. The semiconductor memory device according to claim 1, wherein each of the sense amplifier groups comprises a plurality of sense amplifier sets, each of the sense amplifier sets consisting of neighboring ones of the sense amplifiers in the second direction, each of the column selection signal lines being connected to at least one sense amplifier set on every sense amplifier region.

3. The semiconductor memory device according to claim 1, wherein each of the sense amplifiers is coupled to at least one bit line pair consisting of a pair of the bit lines, and the bit lines constituting each of the bit line pairs extend over one of the memory cell plates.

4. The semiconductor memory device according to claim 3, wherein a first bit line pair is positioned between a second bit line pair and a third bit line pair on one of the memory cell plates, the first bit line pair consists of the bit lines extending from the first sense amplifier, the second bit line pair consists of the bit lines extending from the second sense amplifier, and the third bit line pair consists of the bit lines extending from the third sense amplifier.

5. The semiconductor memory device according to claim 3, wherein, a pair of the bit lines coupled to the first sense amplifier constitutes a first one of the bit line pairs, another pair of the bit lines coupled to the second sense amplifier constitutes a second one of the bit line pairs, and one of the bit lines constituting the first bit line pair is positioned between the bit lines constituting the second bit line pair.

6. The semiconductor memory device according to claim 1, wherein each of the sense amplifiers is coupled to at least one bit line pair consisting of a pair of the bit lines, the bit lines constituting each of the bit line pairs extend over different ones of the memory cell plates from each other.

7. A semiconductor memory device comprising:
   first and second column selection signal lines;
   first bit lines being associated with the first column selection signal line;
   second bit lines being associated with the second column selection signal line, the first and second column selection signal lines twisting so that at least one of the first bit lines is positioned between two of the second bit lines;
   a plurality of memory cell plates, each of the memory cell plates including associated ones of the first bit lines and associated ones of the second bit lines;

a plurality of sense amplifier regions, the memory cell plates and the sense amplifier regions being alternatively arranged in a first direction; and a plurality of sense amplifier groups arranged on the sense amplifier regions, respectively, each of the sense amplifier groups comprising a plurality of sense amplifiers arranged in a second direction perpendicular to the first direction, the sense amplifiers including first sense amplifiers each associated with the first column selection signal line and second sense amplifiers each associated with the second column selection signal line, the first and second column selection signal lines twisting to cross each other over each of the memory cell plates.

* * * * *